("12") United States Patent
Lyakh et al.

(10) Patent No.: US 10,673,209 B2
(45) Date of Patent: Jun. 2, 2020

(54) QCL WITH WIDE ACTIVE REGION AND THINNED STAGES AND RELATED METHODS

(71) Applicant: UNIVERSITY OF CENTRAL FLORIDA RESEARCH FOUNDATION, INC., Orlando, FL (US)

(72) Inventors: Arkadiy Lyakh, Oviedo, FL (US); Matthew Suttinger, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 0 days.

(21) Appl. No.: 16/029,947

(22) Filed: Jul. 9, 2018

(65) Prior Publication Data

US 2019/0115727 A1    Apr. 18, 2019

Related U.S. Application Data

(60) Provisional application No. 62/529,786, filed on Jul. 7, 2017.

(51) Int. Cl.
| | |
|---|---|
| *H01S 5/34* | (2006.01) |
| *H01S 5/22* | (2006.01) |
| *H01S 5/343* | (2006.01) |
| *H01S 5/022* | (2006.01) |
| *H01S 5/062* | (2006.01) |
| *H01S 5/227* | (2006.01) |
| *H01S 5/024* | (2006.01) |
| *H01S 5/10* | (2006.01) |

(52) U.S. Cl.
CPC ........ *H01S 5/3402* (2013.01); *H01S 5/02236* (2013.01); *H01S 5/02248* (2013.01); *H01S 5/06216* (2013.01); *H01S 5/22* (2013.01); *H01S 5/2275* (2013.01); *H01S 5/343* (2013.01); *H01S 5/02415* (2013.01); *H01S 5/1039* (2013.01); *H01S 2304/02* (2013.01)

(58) Field of Classification Search
CPC .. H01S 5/3401; H01S 5/3402; H01S 5/02248; H01S 5/02236; H01S 5/343; H01S 5/22; H01S 2304/02; H01S 5/02415
See application file for complete search history.

(56) References Cited

U.S. PATENT DOCUMENTS

| | | | |
|---|---|---|---|
| 10,020,635 B1 | 7/2018 | Lyakh | |
| 2008/0304524 A1* | 12/2008 | Marsland, Jr. | ......... B82Y 20/00 372/29.011 |
| 2010/0309942 A1* | 12/2010 | Belkin | ................... B82Y 20/00 372/45.01 |

(Continued)

OTHER PUBLICATIONS

U.S. Appl. No. 15/450,575, filed Mar. 6, 2017 Arkadiy Lyakh.

*Primary Examiner* — Xinning(Tom) Niu
(74) *Attorney, Agent, or Firm* — Allen, Dyer, Doppelt + Gilchrist, PA

(57) ABSTRACT

A QCL may include a substrate, and a semiconductor layer adjacent the substrate and defining an active region. The active region may have an elongate shape extending laterally across the substrate and having a number of stages greater than 25, each stage having a thickness less than 40 nanometers. The active region may have a ridge width greater than 15 μm.

20 Claims, 10 Drawing Sheets

(56) References Cited

U.S. PATENT DOCUMENTS

| | | | |
|---|---|---|---|
| 2011/0080930 A1* | 4/2011 | Liu | B82Y 20/00 |
| | | | 372/45.012 |
| 2012/0327965 A1* | 12/2012 | Shinoda | H01S 5/125 |
| | | | 372/36 |
| 2018/0048118 A1 | 2/2018 | Lyakh | |

* cited by examiner

US 10,673,209 B2

QCL WITH WIDE ACTIVE REGION AND THINNED STAGES AND RELATED METHODS

GOVERNMENT RIGHTS

This invention was made with government support under grant N00014-16-1-2424, awarded by Office of Naval Research. The government has certain rights in the invention.

RELATED APPLICATION

This application is based upon prior filed Application No. 62/529,786 filed Jul. 7, 2017, the entire subject matter of which is incorporated herein by reference in its entirety.

TECHNICAL FIELD

The present disclosure relates to lasers and, in particular, to quantum cascade laser and related methods.

BACKGROUND

Quantum cascade lasers (QCLs) differ from traditional semiconductor diode lasers in that they do not use a p-n junction for light emission. Multiple active regions are "cascaded" so that each injected electron can emit multiple photons and therefore enhance laser gain. Each active region includes a multi-layered semiconductor material structure. This multi-layered semiconductor material structure is designed to have an electronic band structure that gives the desired emission wavelength, and is manufactured with nanometer-level thickness control.

Most commercially available QCLs are of the "edge-emitting" variety. In these, linear ridges are created by etching vertically through the layered structure, which has been grown on a wafer substrate. These are cleaved so that the active region comprises a rectangular ridge several millimeters in length, which forms a waveguide. The laser radiation is amplified by passing back and forth along the axis of the ridge. Laser emission occurs on the end facets of these ridges.

SUMMARY

Generally, a QCL may include a substrate, and a semiconductor layer adjacent the substrate and defining an active region. The active region may have an elongate shape extending laterally across the substrate and may have a number of stages greater than 25. Each stage may have a thickness less than 40 nanometers, and the active region may have a ridge width greater than 15 µm.

In particular, each stage may comprise a plurality of epitaxial layers. Each stage may have a substantially identical thickness. The substrate may comprise indium phosphide (InP), for example. The active region may be configured to emit laser output with a wavelength in a range of 3 to 12 µm.

In some embodiments, the active region may be configured to emit a continuous wave (CW) laser output through the substrate or from the edge the laser chip. The active region may be configured to emit the CW laser output at a power greater than or equal to 5 watts. In other embodiments, the active region may be configured to emit a peak pulsed laser output through the substrate or from the edge the laser chip.

Another aspect is directed to a QCL system. The QCL system may include a QCL comprising a substrate, and a semiconductor layer adjacent the substrate and defining an active region. The active region may have an elongate shape extending laterally across the substrate and may have a number of stages greater than 25. Each stage may have a thickness less than 40 nanometers. The active region may have a ridge width greater than 15 µm. The QCL system may include a driver circuit coupled to the QCL.

Yet another aspect is directed to a method for making a QCL. The method may include forming a substrate, and forming a semiconductor layer adjacent the substrate and defining an active region. The active region may have an elongate shape extending laterally across the substrate and may have a number of stages greater than 25. Each stage may have a thickness less than 40 nanometers. The active region may have a ridge width greater than 15 µm.

DETAILED DESCRIPTION

Figure 1:
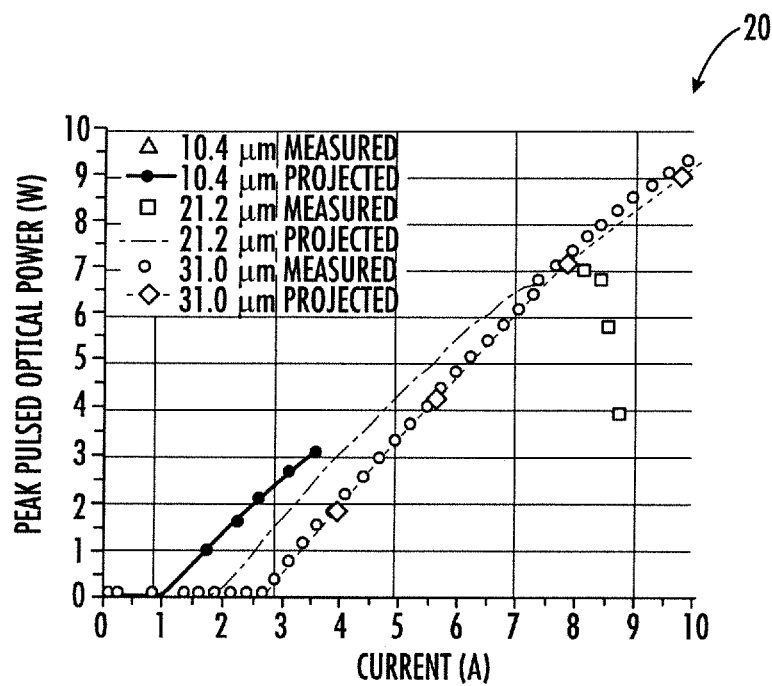
FIGS. 1-2 are diagrams of peak pulsed optical power, and continuous wave (CW) optical power, respectively, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Generally, a QCL may include a substrate, and a semiconductor layer adjacent the substrate and defining an active region. The active region may have an elongate shape extending laterally across the substrate and have an increased number of stages, each stage having a reduced thickness. Also, in some embodiments, the semiconductor layer can comprise InGaAs waveguide layers.

Experimental and model results for 15-stage broad area quantum cascade lasers are presented. Continuous wave power scaling from 1.62 W to 2.34 W has been experimentally demonstrated for 3.15 mm-long, high reflection-coated quantum cascade lasers for active region width increased from 10 µm to 20 µm. A semi-empirical model for broad area devices operating in continuous wave mode is presented. The model uses measured pulsed transparency current, injection efficiency, waveguide losses, and differential gain as input parameters. It also takes into account active region self-heating and sub-linearity of pulsed power vs current laser characteristic. A good agreement between the model and experimental continuous wave results for the 15-stages devices with different ridge widths is demonstrated. The model is subsequently used to study several possible device configurations. The model predicts that maximum CW optical power exceeding 8.2 W can be achieved from 3.15 mm×80 µm devices with 35 stages and a reduced stage thickness of 350 Å. The effects of characteristic temperature of slope efficiency, T1, and threshold current, T0, are then explored in the model. The model projects that power level can be increased to ~4.5 W from 3.15 mm×30 µm devices with T0 increased from 140 K for the present design to 250 K. Finally, the model shows that despite increased thermal resistance, employment of InGaAs waveguide layers leads to increased power in continuous wave operation in the broad area configuration due to increased mode confinement.

Introduction

QCLs are semiconductor lasers that operate on intersubband transitions within the conduction band of a quantum well structure. This design feature allows for the tailoring of the gain spectrum between mid-infrared (mid-IR) and terahertz wavelengths, making them an attractive technology for the engineering of highly efficient coherent infrared sources.

At room temperature, pulsed QCLs have been demonstrated to operate at wall-plug efficiencies up to 28%[1,2]. Continuous wave (CW) operation allows for more energy to be deposited over a span of time, causing an increase in temperature and lowering efficiency. QCLs operating in CW have been shown to operate at wall-plug efficiencies up to 21%[2].

The authors have recently demonstrated high performance QCLs with a reduced number of stages in the standard narrow-ridge configuration. Specifically, a 2.1 mm-long device with a 10.4 µm-wide, 15-stage active region (active region design was presented in Ref. 1) achieved output power over 2 W in pulsed mode and ~1 W in CW mode at 20° C. Measured pulsed and CW efficiencies were 18% and 12%, respectively. Rollover current density $J_{RO}$ of 11.4 kA/cm², transparency current $J_{tr}$ of 1.61 kA/cm², differential gain $\Gamma g$ of 2.4 cm/kA, injection efficiency $\eta_i$ of ~72%, free carrier losses in the cladding layers $\alpha_{cl}$ of 0.70 cm$^{-1}$, and active region losses $\alpha_{AR}$ of 1.37 cm$^{-1}$ were measured for the 15-stage structure. Also, characteristic temperatures $T_0$=140 K and $T_1$=710 K were measured for this active region design. Waveguide designs for the 40-stage structure presented in Ref. 1 and the 15-stage structure were the same. These results showed that high performance operation can be achieved for QCLs with reduced number of stages. An analysis of the temperature gradient of a broad area QCL (ridge width >15 µm) in a one dimensional model has demonstrated[3] that devices with a reduced number of stages can be engineered to keep active region temperature within a range that allows for CW operation. This was then experimentally demonstrated with a 4 mm-long device with a ~30 µm-wide, 10-stage active region[3]. However, continuous wave power scaling, i.e. increase in optical power with increase in ridge width beyond its standard value of ~10 µm, was not demonstrated.

Experimental Results

A 15-stage QCL material with active region and waveguide designs discussed in Ref. 1 was grown with molecular beam epitaxy and then processed into the standard buried heterostructure (BH) configuration. The processed wafer was subsequently cleaved into 3.15 mm-long chips with various ridge widths. The chips were mounted on aluminum nitride submounts, epi-down to reduce laser thermal resistance. Scanning electron microscope imaging revealed the resulting devices to have 10.4 µm, 21.2 µm, and 31.0 µm ridge width.

The devices were first tested in pulsed mode and found to have threshold currents of 0.99 A, 1.79 A, and 2.63 A, and slope efficiencies of $$1.44\frac{W}{A}, 1.41\frac{W}{A}, \text{ and } 1.45\frac{W}{A},$$

for 10.4 µm, 21.2 µm, and 31.0 µm-wide active region devices, respectively. The results of the pulsed measurements are shown in diagram 20 of FIG. 1 overlaid with simulation results to be discussed later in the manuscript. The maximum current of the laser driver is 10 A, preventing the observation of rollover for the 31.0 µm wide device predicted to be ~11 A. Devices emitted at a wavelength of ~5.5 µm in pulsed mode.

The devices were then tested in CW operation on a thermoelectric cooler set to 20° C. CW operation exhibits a thermal rollover current density lower than the pulsed rollover current density caused by heat buildup in the active region. The 10.4 µm, 21.2 µm, and 31.0 µm wide active region devices had threshold currents of 1.12 A, 2.40 A, and 3.85 A, with maximum powers at thermal rollover of 1.62 W, 2.34 W, and 1.70 W, respectively. The CW optical power increase from 1.62 W to 2.34 W for ridge width increase from 10 µm to 20 µm is the first demonstration of CW optical power scaling in the broad area configuration. It is a direct consequence of a reduced thermal resistance for QCLs with a reduced number of stages: Calculated thermal resistance for a 21.2 µm-wide, 15-stage QCL with the base design is 3.4 K/W vs 4.7 K/W for the 40-stage design. The results of the CW measurements are shown in diagram 25 of FIG. 2 also overlaid with simulation results to be discussed later in the text.

Figure 2:
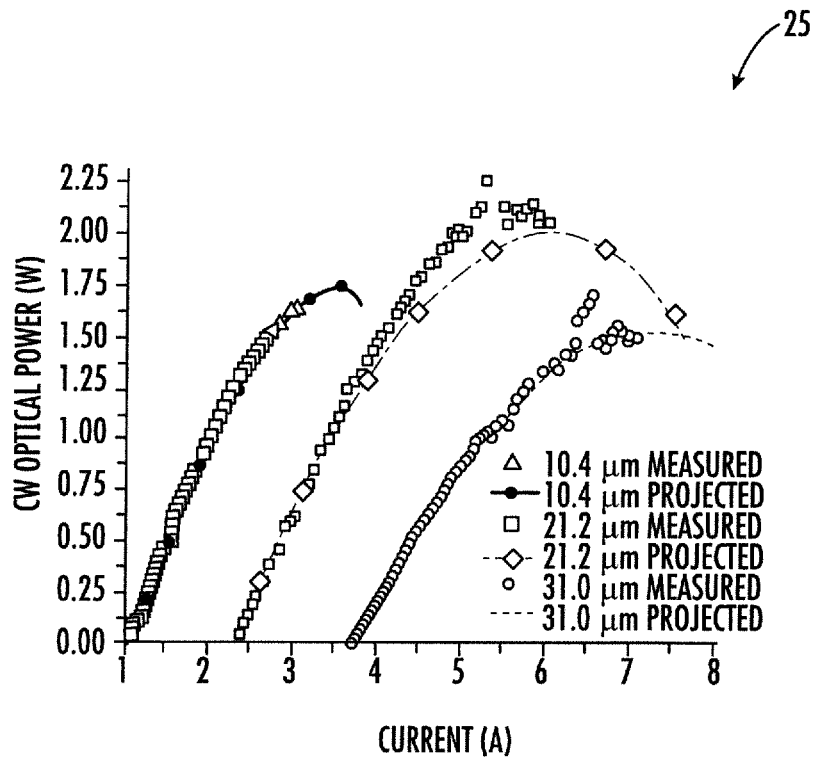

Referring now to FIG. 1, which shows experimental pulsed power for the 3.15 mm long, 15-stage HR (high reflection)-coated devices as data points, with projected pulsed power as solid lines. 10.4 µm-wide active region device in dashed line, 21.2 µm in crossed line, and 31.0 µm in regular line. Referring now to FIG. 2, which shows experimental CW power for the 3.15 mm long, 15-stage HR-coated devices as data points, with projected CW power as solid lines. 10.4 µm wide active region device in dashed line, 21.2 µm in crossed line, and 31.0 µm in regular line.

Semi-Empirical Model

The ability to predict CW performance for a QCL configuration that is based on a given active region stage design can serve as a useful tool for the QCL performance optimization without the need to fabricate and test each proposed device. Simulation of QCL characteristics from first principles is a very complex and computationally intensive problem. A much simpler model predicting CW power for various device geometries based on a known active region design can be constructed using experimental pulsed data for the given design. The simple semi-empirical model developed in this work uses the measured values for transparency current, losses, differential gain, injection efficiency, and sub-linearity of a pulsed power vs current density (LI) characteristic as input model parameters to project pulsed LI characteristics for devices with an arbitrary configuration but the same layer sequence in the stage (variable cavity length, number of stages, doping, ridge width, etc.). A COMSOL waveguide simulation (software available from the COMSOL Corporation of Stockholm, Sweden) is used to account for changing mode overlap factor with the active region ($\Gamma$) for devices with different number of stages. The model is subsequently linked to a COMSOL thermal simulation to take into account active region self-heating in CW mode and to project CW LI characteristics.

When in pulsed operation, a QCL will reach a threshold current defined by the properties of its quantum well structure and the geometry of the waveguide:

$$I_{th,pulse} = wL\left(J_{tr} + \frac{\alpha_M + \alpha_{WG}}{\Gamma_g}\right) \quad (1)$$

where active region width is defined as w and device length is defined as L.

Near threshold, pulsed power scales linearly with current. This linear relationship is defined by the slope efficiency, the additional power gained per unit current:

$$\eta_{S,pulse} \approx N_s\left(\frac{hc}{\lambda q_e}\right)\left(\frac{\alpha_M}{\alpha_M + \alpha_{WG}}\right)\left(\frac{1}{1 + \tau_3/\tau_4}\right)\eta_i \quad (2)$$

The terms in Equation 2 are as follows: number of active region stages, $N_s$, wavelength, $\lambda$, lower laser lifetime, $\tau_3$, and upper laser lifetime, $\tau_4$. Slope efficiency has a sub-linear dependence at high bias as injection efficiency for the upper laser level reduces. A rigorous theoretical treatment for injection efficiency would needlessly complicate the model, so an envelope is applied to the LI curve to replicate the curvature of the experimental results. This is done with a parametrization of LI characteristic for a given design at large bias.

The portion of the semi-empirical model discussed above is sufficient to project LI characteristics for devices with a given active region stage design in different configurations. Because short pulses (100s of nanoseconds) and low enough duty cycle prevent temperature build up in the active region, the active region is taken to be at a fixed temperature. However, CW operation allows for continual buildup of heat that both increases threshold current and decreases slope efficiency at threshold. This thermal behavior is typically described with characteristic temperatures $T_0$ and $T_1$:

$$I_{th,cw} = I_{th,pulse}e^{\frac{T-T_i}{T_0}} \quad (3)$$

$$\eta_{S,cw} = \eta_{S,pulse}e^{\frac{T-T_i}{-T_1}} \quad (4)$$

The terms in equations 3 and 4 are as follows: CW threshold current, $I_{th,cw}$, CW slope efficiency at threshold, $\eta_{S,cw}$, the ambient temperature without heat buildup (i.e., the temperature set by a thermoelectric controller,) $T_i$, characteristic temperature for threshold current density (taken from experiment,) $T_0$, and characteristic temperature for slope efficiency (taken from experiment,) $T_1$.

A projection of CW power above threshold requires consideration for thermal effects. By introducing a temperature varying with current, the derivative of power with respect to current is redefined:

$$\frac{dP}{dI} = \frac{\partial P}{\partial I} + \frac{\partial P}{\partial T}\frac{\partial T}{\partial I} \quad (5)$$

The first term is taken as the partial derivative with respect to current at threshold:

$$\frac{\partial P}{\partial I} = \eta_{S,cw}(T) \quad (6)$$

For the second term, partial derivative of temperature with respect to current is taken from COMSOL thermal simulations and $$\frac{\partial P}{\partial T}$$

is found as:

$$\frac{\partial P}{\partial T} = \frac{\partial}{\partial T}[\eta_{S,cw}(T) * (I - I_{th,cw}(T))] \quad (7)$$

In the thermal simulation, a linear model on current density approximates the linear portion of the voltage for the device. The linear model is given by a voltage offset, $V_0$, and a differential resistance, $R_d$, that scale with number of stages. Electrical power is deposited in the active region as the product of voltage and current, where the voltage is taken as:

$$V = N_s(V_0 + JR_d) \quad (12)$$

The active region is assigned a cross plane thermal conductivity, $k_\perp$, and an in plane thermal conductivity, $k_\parallel$. A stationary solution is found where the mean temperature in the active region is taken to be T.

For projections involving a change in the active region doping, it was assumed that transparency current (defined by backscattering), roll-over current density, and losses originating from the active region (non-resonant intersubband losses) are all directly proportional to doping level.

The simulation was written as a script in MATLAB, taking in the temperature and waveguide results from COMSOL output. It predicted pulsed threshold currents of 0.91 A, 1.80 A, and 2.63 A, and slope efficiencies of $$1.61\frac{W}{A}, 1.60\frac{W}{A}, \text{ and } 1.60\frac{W}{A},$$

for 10.4 µm, 21.2 µm, and 31.0 µm wide active region devices, respectively. The results of the pulsed simulation vs the pulsed experimental data are shown in FIG. 1.

For CW operation, the best fit with the experimental data was found for $$k_\perp = 0.9\frac{W}{mK} \text{ and } k_\| = 5\frac{W}{mK},$$

both values in accordance with parameters used in Ref. 3. Using these values for cross plane and in plane thermal conductivities, the simulation predicted threshold currents of 1.04 A, 2.28 A, and 3.71 A, for 10.4 µm, 21.2 µm, and 31.0 µm-wide active region devices, respectively. Overall, there was a good agreement between the model and experimental CW results for devices with different ridge widths (FIG. 2).

Importance of High Values for Characteristic Temperatures $T_0$ and $T_1$

Figure 3:
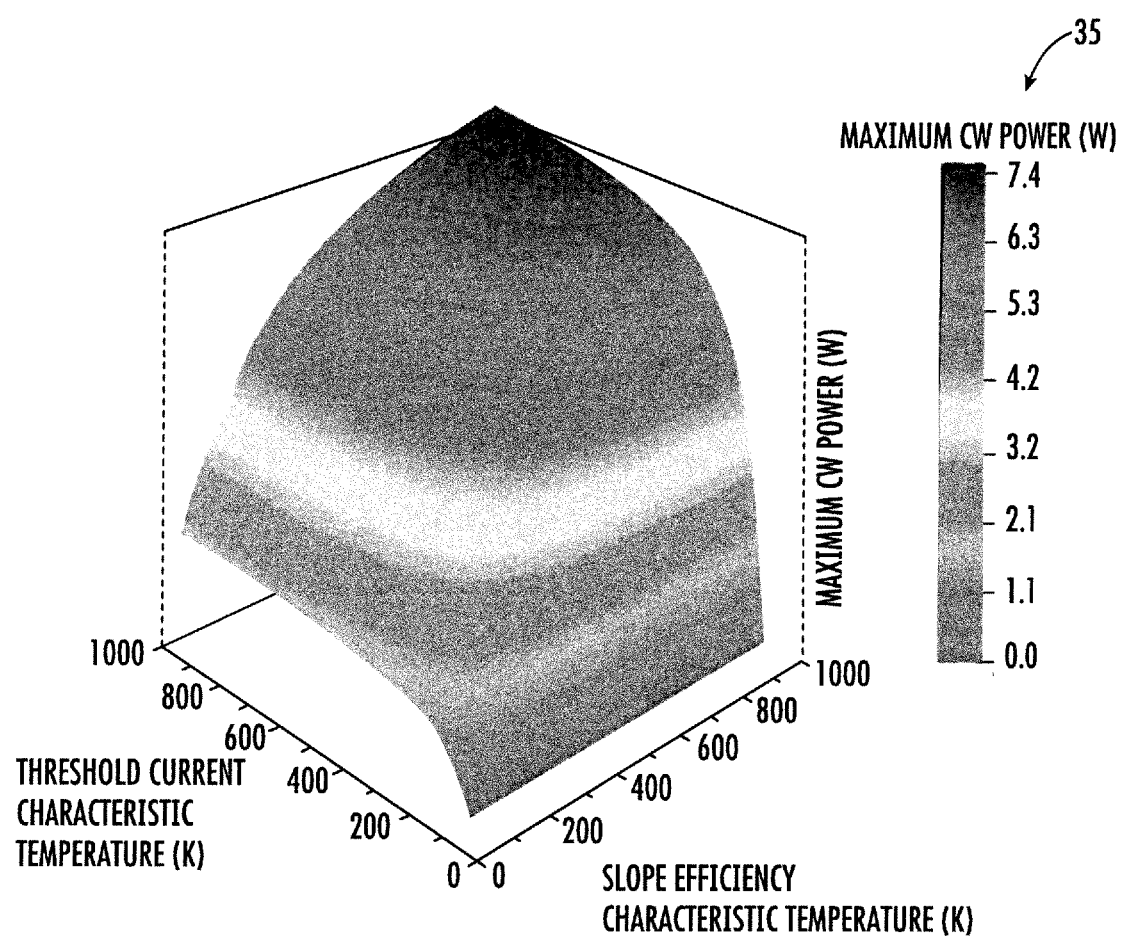
FIG. 3 is a 3D plot of maximum CW power for devices for various values of characteristic temperatures $T_0$ and $T_1$, according to the present disclosure.

Higher characteristic temperatures of slope efficiency, $T_1$, and threshold current, $T_0$, indicate greater stability of these laser characteristics under temperature change, leading to higher output powers in CW operation. FIG. 3 (diagram 35) summarizes the maximums powers projections for a 3.15 mm-long device with the 31 µm-wide, 15-stage active region (base design) for different values of $T_0$ and $T_1$ used in Formulas 3 and 4. All other input parameters for the model were taken the same as before. A $T_0$ of 100 K will prevent the laser from reaching threshold in CW mode. If $T_0$ is increased from 140 K for the base design to 250 K, a realistic number reported for a number of high performance structures[2,4,5], while keeping $T_1$ at 710 K, a 31 µm-wide, 15-stage laser is projected to produce 4.5 W of CW power vs. 1.6 W for the base design for the same ridge width (FIG. 2). The 31 µm ridge width was used as a baseline as it is the most prone to temperature increase of the devices tested. These simulation results clearly show that the low value of $T_0$ is the main weakness of the base device if the structure is intended to be used in the broad area configuration. Characteristic temperatures for both threshold current and slope efficiency are strongly affected by carrier leakage in the superlattice, with threshold current also being strongly affected by backfilling[5]. As discussed in Ref. 1, the low value of $T_0$ for the base design is likely caused by backscattering from level 2 that is tightly confined in the active region. In moving forward, efforts to re-engineer the superlattice for the base design should focus on improvement in $T_0$, while $T_1$ value is already sufficiently high.

Referring now to FIG. 3, which shows a 3D plot of maximum CW power for 31.0 µm wide base design as a function of slope efficiency characteristic temperature and threshold current characteristic temperature. Both characteristic temperatures were varied in the range from 100 K to 1000 K. Scale is blue to red, with dark blue indicating no power out and red indicating higher power out.

Projections for Separate Confinement Heterostructure Design

Reducing number of active region stages results into a lower confinement factor, but allows for greater heat transfer out of the active region. Specifically, Γ reduces from 64% to 20% when number of stages in the 20 µm-wide base design reduces from 40 to 15. To compensate for lower mode confinement, additional InGaAs waveguide layers are often introduced near the active region with a refractive index somewhat higher than that for the active region. This promotes stronger guiding near the active region, increasing mode confinement (separate-confinement heterostructure). However, InGaAs, being a ternary material, suffers from a thermal conductivity an order of magnitude lower than that of InP composing the rest of the waveguide. Simulations of an added spacer layer to a 31 µm-wide, 15-stage active region device showed increases in mean temperature in the active region. An exemplary 0.3 µm-thick InGaAs layer placed on either side of the active region provides increase in Γ from 20% to 30%, while causing an additional temperature increase of 5 K at thermal rollover compared to that for the base design. Maximum CW power for this design increased from 1.6 W without spacers to 2.0 W with spacers. The temperature distribution of these designs are shown in diagrams 40, 45 of FIG. 4.

Figure 4:
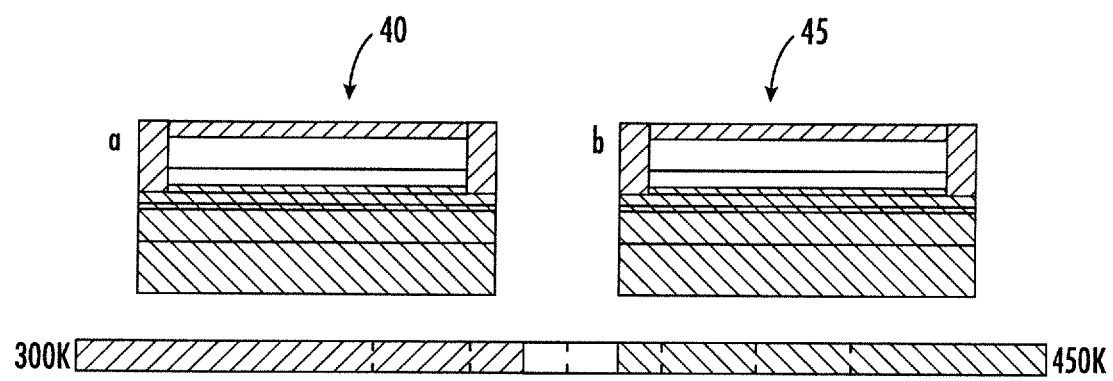
FIG. 4 is a diagram of simulated temperature for devices comprising InGaAs waveguide layers, according to the present disclosure.

Referring now to FIG. 4, which shows a simulated temperature for 31 µm-wide, 15-stage active region. a) No InGaAs spacers around the active region. b) 0.3 µm InGaAs spacers on both sides of the active region. These results show that the thermal blanket effect of the spacer material is outpaced by the benefits of increased mode confinement for a small number of stages. Increased power and efficiency in CW operation is possible by optimizing the thickness of such spacer layers. The optimal InGaAs thickness will strongly depend on emission wavelength, number of stages, and thickness of each stage.

Projections for Short Injector Design

The base active region design explored in this manuscript has a single stage thickness of ~45 nm. As explained above, the primary obstacle in broad area CW performance is the vertical extraction of heat through the active region. In addition to reduction in number of stages, laser thermal resistance can be reduced by reducing the thickness of each active region stage. These are so-called short-injector and injector-less designs[6,7]. Reduction in the stage thickness results in higher electrical power density dissipated in the active region, lower mode confinement, and a shorter distance between the active region center and nearest InP cladding layer.

To provide guidelines for the development of broad area devices with a reduced stage thickness, voltage drop per stage was assumed to be independent of stage thickness, while gain coefficient is assumed to be inversely proportional to stage thickness. The simulation was then swept through a four dimensional parameter space of relative doping, active region stage thickness, number of stages, and active region width. The highest projected CW maximum power was obtained for an 80 µm-wide, 35-stage active region with stage thickness of 35 nm and doping level of approximately 30% of its base value. These parameters for a 3.15 mm-long device are projected to result into an optical power level exceeding 8.2 W. $T_0$=250 K and $T_1$=710 K were used in the simulation. FIGS. 10-13 demonstrate that detuning for any of these four parameters from the optimal configuration results in decreased power. These results show that stage length should be minimized in the active region design intended for the broad area configuration, while keeping high wall plug efficiency. The reduced stage thickness shifts the optimal number of stages to the range of 30 to 40, i.e. to the traditional range for high power QCLs.

Conclusion

The 15-stage QCL structure demonstrated the ability to scale the CW optical power by increasing the width of the active region. The devices measured featured maximum power exceeding 1 W in CW, with a 21.2 μm-wide, 15-stage active region device having a maximum power of 2.34 W. This device exhibited a pulsed rollover current of ~8 A with a thermal rollover of ~5 A in CW.

The semi-empirical model presented in the manuscript successfully predicts pulsed and CW experimental power curves for devices with different ridge width. The curvature due to both rollover current and thermal effects is replicated in model from fitting parameters and base principles. The model was subsequently used to project QCL power in different configurations. A very high power configuration for 3.15 mm-long chips with 35-nm thick stage design is predicted for 30% active region doping at an 80 μm-wide, 35-stage active region. QCLs in this configuration are projected to have maximum CW power exceeding 8.2 W.

Figure 5:
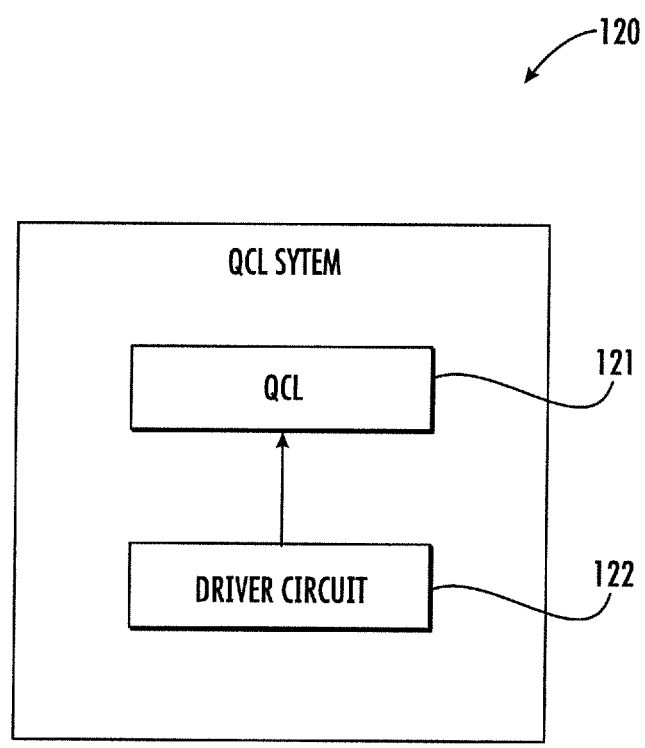
FIG. 5 is a schematic diagram of QCL system, according to the present disclosure.
Figure 6A:
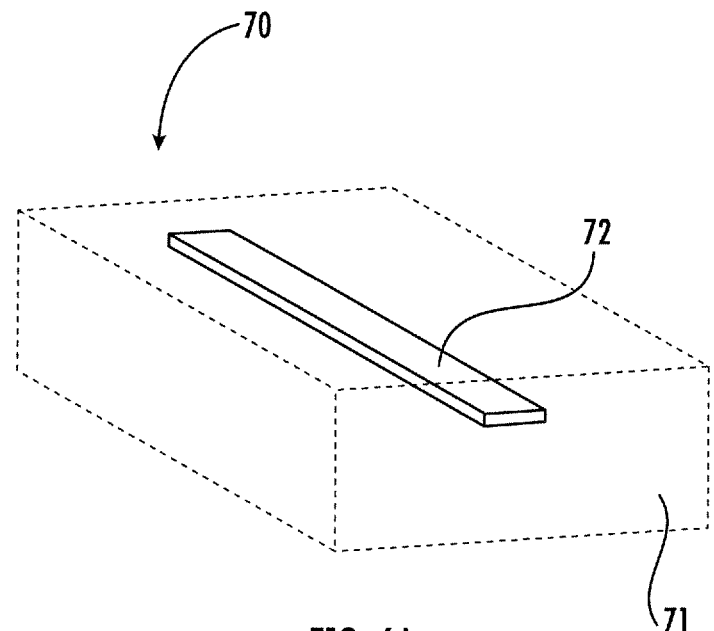
FIGS. 6A and 6B are schematic perspective views of QCLs, according to the prior art and the present disclosure, respectively.
Figure 6B:
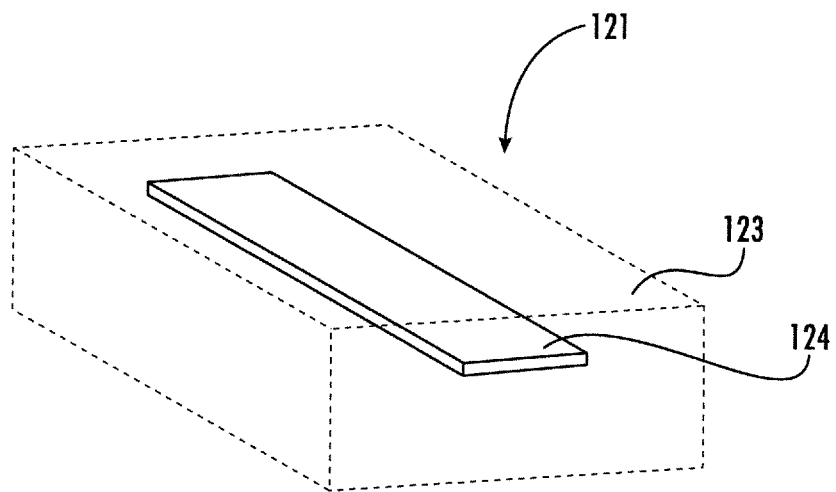
Figure 7:
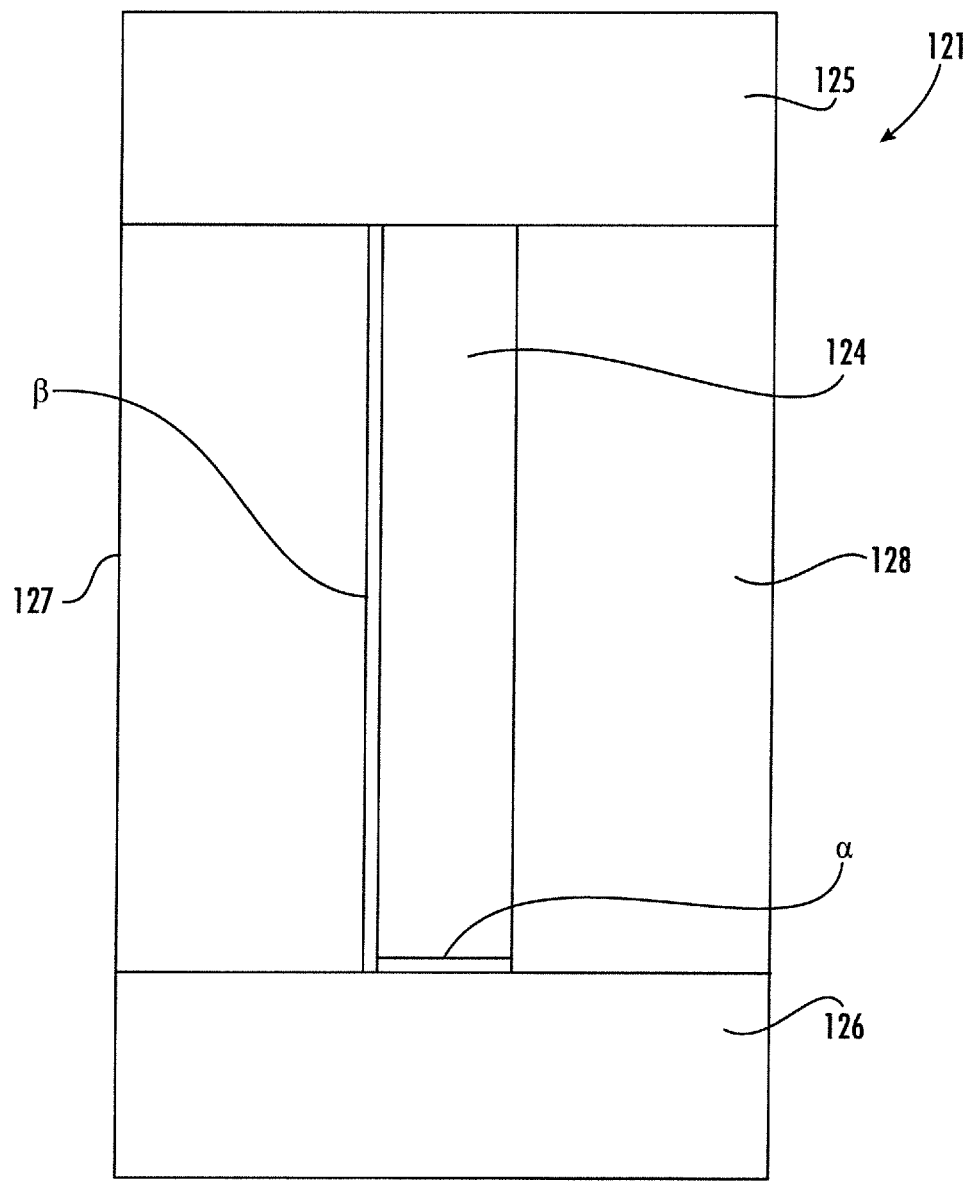
FIG. 7 is a schematic cross sectional view of a face of an example embodiment of the QCL, according to the present disclosure.

Referring now to FIGS. 5, 6B, and 7, a QCL system 120 according to the present disclosure is now described. The QCL system 120 illustratively includes a QCL 121, and a driver circuit 122 coupled to the QCL. The QCL 121 illustratively includes a substrate 123, and a semiconductor layer adjacent the substrate and defining an active region 124. The active region 124 illustratively has an elongate shape extending laterally across the substrate 123 and has a number of stages greater than 20. Each stage has a thickness less than 40 nanometers, and the active region 124 has a ridge width greater than 15 μm. This is contrast to the prior art structure QCL 70 shown in FIG. 6A, which has a narrow (10 μm) and thick (2 μm) active region 72 in a substrate 71.

In some embodiments, the active region 124 is configured to emit a CW laser output through the substrate 123. The active region 124 is configured to emit the CW laser output at a power greater than or equal to 5 watts. In other embodiments, the active region 124 is configured to emit a peak pulsed laser output through the substrate 123.

The substrate may comprise indium phosphide (InP), for example, but other semiconductor materials can be used. The active region 124 may be configured to emit laser output with a wavelength in a range of 3 to 12 μm, i.e. mid wave and long wave infrared radiation.

As perhaps best seen in FIG. 7, the QCL 121 illustratively includes first and second doped cladding layers 127, 128 sandwiching the active region 124 (i.e. the laser core). The QCL 121 illustratively includes first and second insulating sidewalls 125, 126, and the active region 124 and the doped cladding layers 127, 128 extending between the first and second insulating sidewalls. As will be appreciated, during a method for manufacture of the QCL 121, the base semiconductor wafer is processed as a ridge via etching before the first and second insulating sidewalls 125, 126 are grown.

As noted above, the active region 124 comprises a plurality of stages, in some embodiments greater than 25 stages. Each stage, in turn, may have a thickness 40 nanometers or less. The length β (i.e. the ridge width) of the active region 124 is greater than 15 μm.

Figure 8:
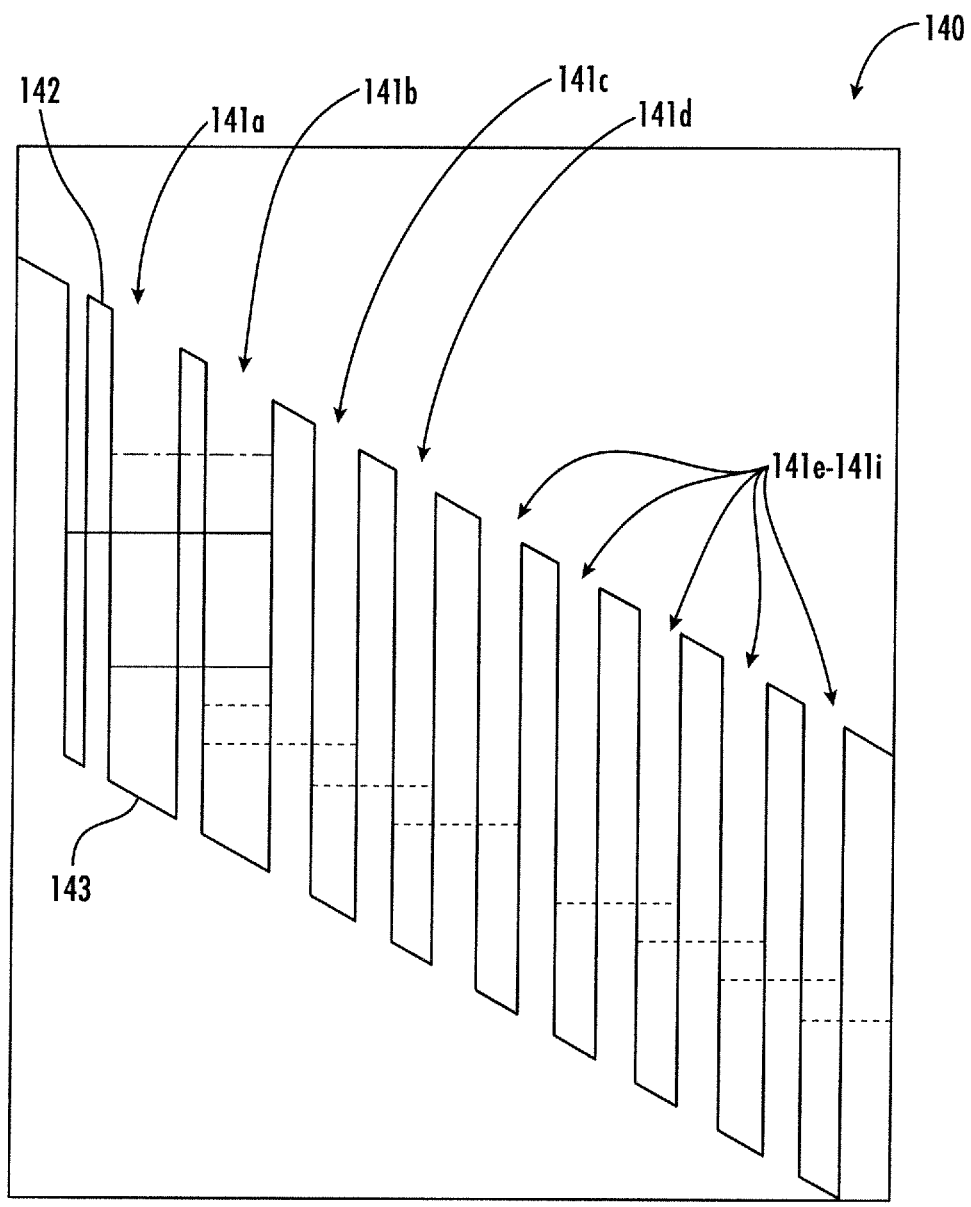
FIG. 8 is a diagram of layers within a stage of an example embodiment of the QCL, according to the present disclosure.

Referring now additionally to FIG. 8, each stage of the active region 124 stage comprises a sequence of nanometer scale layers grown in an order that, when a voltage is applied, creates a series of quantum wavefunctions (each with an associated energy level) that an electron can transition through, giving off laser light via stimulated emission. As shown in diagram 140, a layer sequence is shown, with energy levels drawn on top of the layer sequence's potential energy profile in black.

In the illustrated embodiment, each stage 141a-141i of the active region 124 comprises a two material sequence. One material layer 142 has a high bandgap energy, and creates quantum barriers (i.e. the high points). The other material layer 143 has a lower bandgap energy, and creates the quantum wells (i.e. the low points). A given design can be adjusted to change a number of parameters, including laser wavelength, by changing the energy difference between the barriers and the wells, along with the thickness of each layer and the number of well-barrier pairs.

Also, the superlattice of the substrate comprises a plurality of epitaxial layers. Each stage may have a substantially identical thickness. In particular, the substantially identical thickness for each epi-layer in the stage is often defined as being within ±5 Angstroms.

Figure 9:
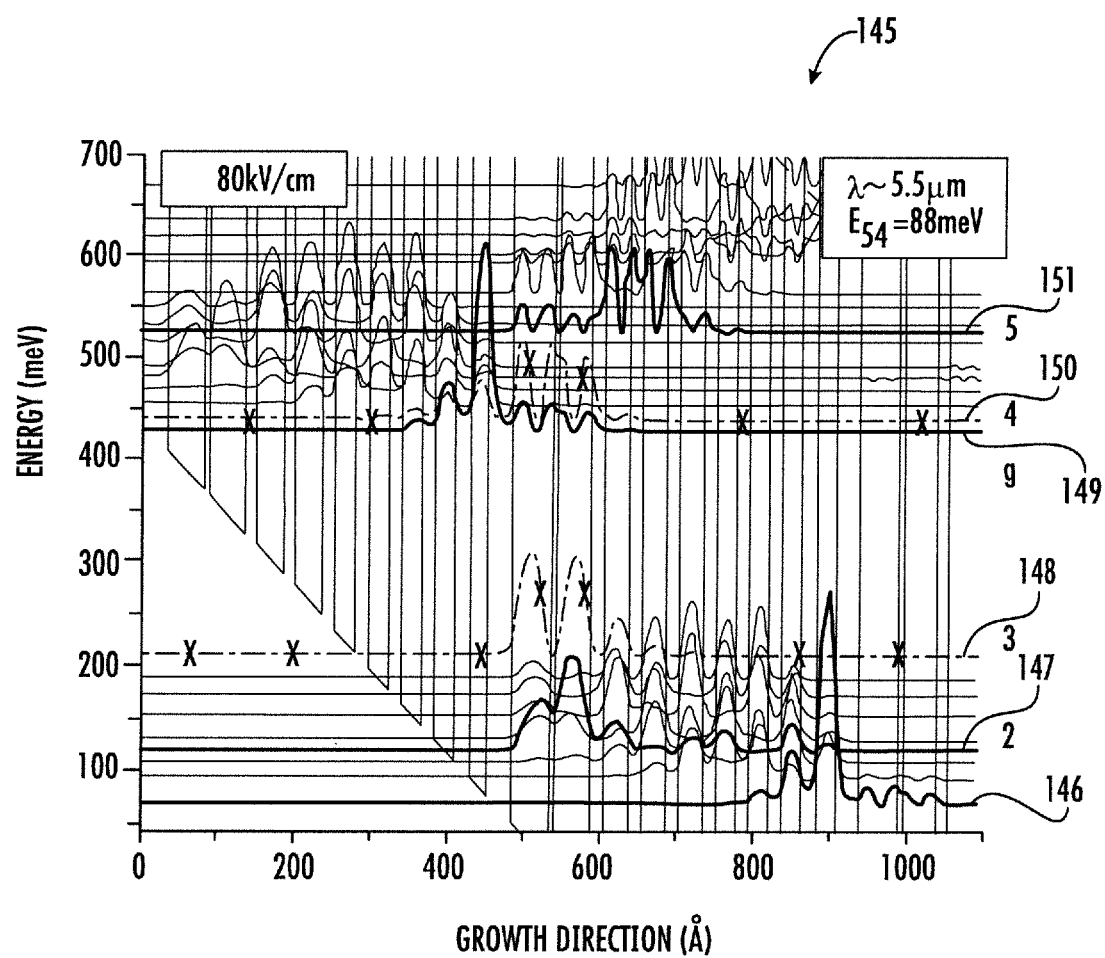
FIG. 9 is a diagram of quantum well transitions within a stage of an example embodiment of the QCL, according to the present disclosure.
Figure 10:
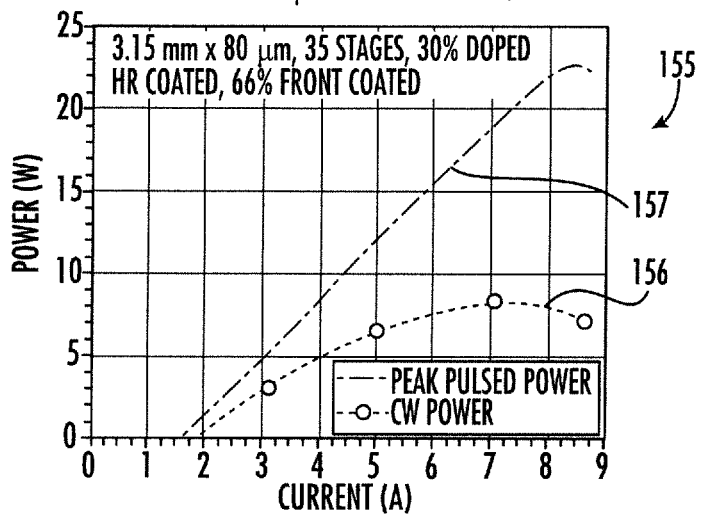
FIG. 10 is a diagram of pulsed peak power and CW power for a 35 stage, 3.15 mm×80 µm device, according to the present disclosure.
Figure 11:
FIG. 11 is a diagram of projected maximum CW power as a function of number of active region stages, according to the present disclosure.
Figure 12:
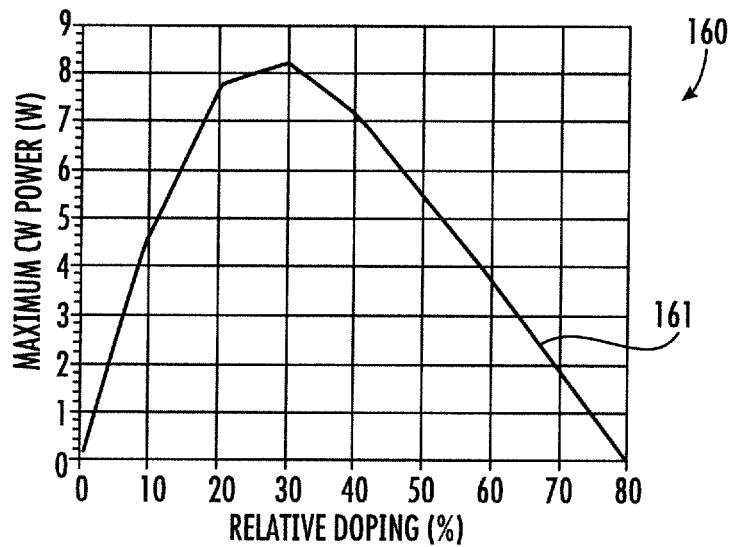
FIG. 12 is a diagram of projected maximum CW power as a function of number of relative doping, according to the present disclosure.
Figure 13:
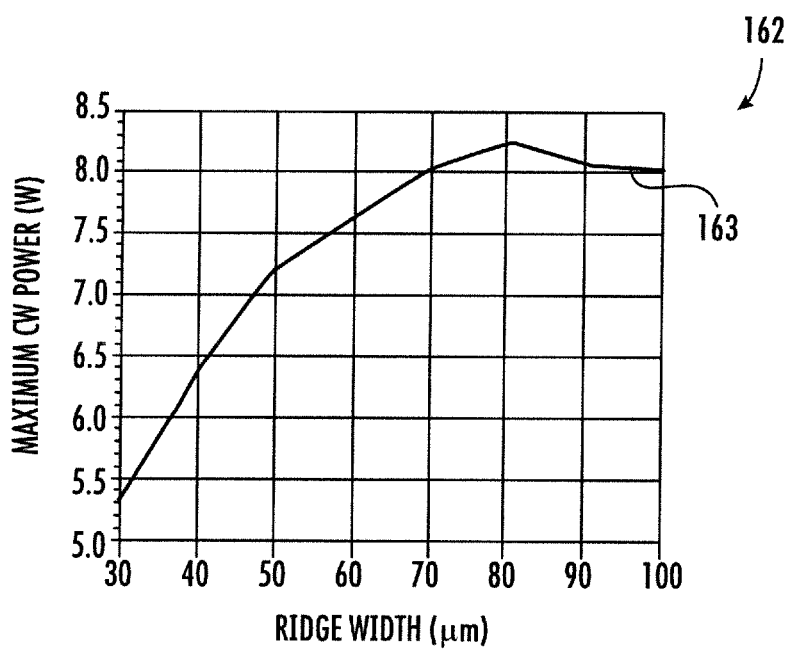
FIG. 13 is a diagram of projected maximum CW power as a function of number of ridge width, according to the present disclosure.

Referring now additionally to FIG. 9, a diagram 145 shows energy levels for each stage of an exemplary active region 124. Of course, this illustration is exemplary in nature, and the energy transitions can be different depending on design of the QCL. In diagram 145, roughly two stages worth of quantum wells are shown. The lighter well-barrier profile in the background shows the potential energy profile. The thicker curves 146-147, 149, 151 in the foreground show the magnitude of the wavefunctions for each energy state, shifted vertically so that zero probability (the flat portions of the wavefunctions) line up with the energy level of the wavefunction. The cross-marked curves 148, 150 are wavefunctions of the upper (4) and lower (3) laser levels. The electron emits a photon by transitioning from 4 to 3.

Yet another aspect is directed to a method for making a QCL 121. The method includes forming a substrate 123, and forming a semiconductor layer adjacent the substrate and defining an active region 124. The active region 124 has an elongate shape extending laterally across the substrate 123 and has a number of stages greater than 25. Each stage has a thickness less than 40 nanometers. The active region 124 has a ridge width greater than 15 μm.

Referring now to FIGS. 10-13, a QCL structure was simulated based on a previously fabricated 5.7 μm emitting structure. 1/L parameters were taken from the previous structure's experimental measurements. The active region stage height was reduced from 45.3 nm to 35 nm (i.e. a short injector design). $T_0$ was increased from 140 K to 250 K (near the higher end of the reported $T_0$ values for midwave devices). $T_1$ was kept at 710 K.

Projections

The structure was simulated in the power projection model. Cavity length was chosen to be 3.15 mm to compare to the previously fabricated structure's 3.15 mm cleaved devices. The structure was assumed high reflectivity (HR) coated on the back facet, and partially reflective coated on the front facet to optimize maximum CW power out. Number of stages, laser core doping concentration, and ridge width were varied to maximize CW power. In diagram 155, curves 156, 157 show power generated, respectively, in CW and pulsed modes of operation.

The optimized configuration was a 3.15 mm long, 80 μm wide, 35-stage thick laser core with 30% doping relative to the reference design. Coating was fully reflective on the back facet and 66% reflective on the front facet to maximize output power. In this configuration, maximum CW power is projected to be 8.25 W. With only a back facet coating, maximum CW power is 5.05 W. Scaling this design to 10 mm long would result in over 25 W of CW power.

Number of Stages

An increase in the number of stages for a given QCL design increases slope efficiency and confinement factor, increasing device power. However, due to poor thermal conduction in the growth direction, an increase in stage number also quickly increases device operating temperature. As shown in diagram 158 of FIG. 11, these effects balance each other out at a moderate number of stages. Given a 3.15 mm×80 µm short injector device with 30% relative laser core doping, as shown by curve 159, the optimal number of stages is 35.

Relative Doping

A decrease in doping lowers both rollover and transparency (and consequentially, threshold) current densities. Operating voltage remains the same, meaning differential resistance increases with the decrease of charge carrying dopants to facilitate current flow. Generally, a decrease in doping will improve device performance if CW dynamic range is significantly smaller than pulsed dynamic range, as the device overheats before current can reach the pulsed rollover value. In CW operation, a moderate or large number of active region stages quickly leads to overheating. A drastic reduction in laser core doping, to the point where CW rollover current is near pulsed rollover current, can control temperature buildup and allow for greater output power. Any further reduction would simply result in the reduction of dynamic range, preventing the device from achieving higher output powers while still have good thermal behavior. As evidenced by curve 161 in diagram 160, given a 3.15 mm×80 µm short injector device with a 35 stage laser core, the optimal relative doping is 30% of the baseline design. All broad-area QCLs demonstrated in the prior art had number of stages of less than 20.

Ridge Width

The width of the laser core stripe, or ridge width, determines modal volume. A wider ridge allows for gain to be utilized and greater confinement to the laser core, but lateral heat extraction is negatively impacted because vertical heat conduction is an order of magnitude weaker than laterally. Traditional designs utilize 8-12 µm ridge widths. With a short injector design, the reduced stage height allows heat to escape vertically more quickly. In certain configurations, the vertical heat extraction can allow for arbitrarily increasing ridge width. Given a 3.15 mm long short injector device with a 35 stage laser core, and 30% relative doping, optimal power is achieved with an 80 µm wide laser core. As shown by curve 163 in diagram 162 of FIG. 13, power rapidly rises with the increases modal gain, but reduces slowly past the optimal point, indicating strong vertical heat conduction due to the reduced stage thickness.

CONCLUSION

The advantage of reduced stage thickness is the ability to rely on vertical heat transport as the primary cooling mechanism for the laser core. This may allow for a broadening of the laser core, and thus, modal area, to potentially an order of magnitude greater than traditional designs.

REFERENCES (THE CONTENT OF EACH OF THESE REFERENCES IS INCORPORATED HEREIN BY REFERENCE IN ITS ENTIRETY)

1. A. Lyakh, M. Suttinger, R. Go, P. Figueiredo, and A. Todi, "5.6 µm quantum cascade lasers based on a two-material active region composition with a room temperature wallplug efficiency exceeding 28%," Appl. Phys. Lett. 109, 121109 (2016)
2. M. Razeghi, N. Bandyopadhyay, Y. Bai, Q. Lu, and S. Slivken, "Recent advances in mid infrared (3-5 µm) Quantum Cascade Lasers," Opt. Mater. Express 3, 1872-1884 (2013)
3. M. P. Semtsiv, and W. T. Masselink, "Above room temperature continuous wave operation of a broad-area quantum-cascade laser," Appl. Phys. Lett. 109, 203502 (2016)
4. Y. Bai, N. Bandyopadhyay, S. Tsao, E. Selcuk, S. Slivken, and M. Razeghi, "Highly temperature insensitive quantum cascade lasers," Appl. Phys. Lett. 97, 251104 (2010)
5. D. Botez, C. C. Chang, L. J. Mawst, Temperature sensitivity of the electro-optical characteristics for mid-infrared ($\lambda$=3-16 µm)-emitting quantum cascade lasers. J. Phys. D: Appl. Phys. 49, 043001 (2016)
6. K. Franz, P. Liu, J. Raftery, M. Escarra, A. Hoffman, S. Howard, Y. Dikmelik, X. Wang, J.-Y. Fan, J. Khurgin, and C. Gmachl, "Short injector quantum cascade lasers," IEEE J. of Quant. Electron. 46, 591 (2010)
7. S. Katz, A. Vizbaras, R. Meyer, and M.-C. Amann, "Injectorless quantum cascade lasers," J. of Appl. Phys. 109, 081101 (2011)

Other features relating to QCLs are disclosed in co-pending applications and issued patents: "QUANTUM CASCADE LASER WITH POWER SCALING AND RELATED METHODS," U.S. Utility patent application Ser. No. 15/450,575, "QUANTUM CASCADE LASER WITH ANGLED ACTIVE REGION AND RELATED METHODS", U.S. Patent Application Publication No. 2018/0048118; and "SPECTROMETER DEVICE WITH STABILIZED LASER AND RELATED DEVICES AND METHODS", U.S. Pat. No. 10,020,635, the contents of which are incorporated herein by reference in their entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A quantum cascade laser (QCL) comprising:
   a substrate; and
   a semiconductor layer adjacent said substrate and defining an active region;
   said active region having an elongated shape extending laterally across said substrate and having a number of stages between 25 and 40, each stage having a thickness less than 40 nanometers;
   said active region having a ridge width greater than 15 µm;
   said active region is configured to emit a continuous wave (CW) laser output at a temperature greater than 250 Kelvin.

2. The QCL of claim 1 wherein each stage comprises a plurality of epitaxial layers.

3. The QCL of claim 2 wherein each of said plurality of epitaxial layers has a substantially identical thickness.

4. The QCL of claim 1 wherein said substrate comprises indium phosphide (InP).

5. The QCL of claim 1 wherein said active region is configured to emit laser output with a wavelength in a range of 3 to 12 µm.

6. The QCL of claim 1 wherein said active region is configured to emit the CW laser output through said substrate.

7. The QCL of claim 6 wherein said active region is configured to emit the CW laser output at a power greater than or equal to 5 watts.

8. The QCL of claim 1 wherein said active region is configured to emit a peak pulsed laser output through said substrate.

9. A quantum cascade laser (QCL) system comprising:
   a QCL comprising
      a substrate, and
      a semiconductor layer adjacent said substrate and defining an active region,
      said active region having an elongated shape extending laterally across said substrate and having a number of stages between 25 and 40, each stage having a thickness less than 40 nanometers,
      said active region having a ridge width greater than 15 μm,
      said active region is configured to emit a continuous wave (CW) laser output at a temperature greater than 250 Kelvin; and
   a driver circuit coupled to said QCL.

10. The QCL system of claim 9 wherein each stage comprises a plurality of epitaxial layers.

11. The QCL system of claim 10 wherein each stage has a substantially identical thickness.

12. The QCL system of claim 9 wherein said substrate comprises indium phosphide (InP).

13. The QCL system of claim 9 wherein said active region is configured to emit laser output with a wavelength in a range of 3 to 12 μm.

14. The QCL system of claim 9 wherein said active region is configured to emit CW laser output through said substrate.

15. The QCL system of claim 14 wherein said active region is configured to emit the CW laser output at a power greater than or equal to 5 watts.

16. The QCL system of claim 9 wherein said active region is configured to emit a peak pulsed laser output through said substrate.

17. A method for making a quantum cascade laser (QCL), the method comprising:
   forming a substrate; and
   forming a semiconductor layer adjacent the substrate and defining an active region;
   the active region having an elongated shape extending laterally across the substrate and having a number of stages between 25 and 40, each stage having a thickness less than 40 nanometers;
   the active region having a ridge width greater than 15 μm;
   the active region is configured to emit a continuous wave (CW) laser output at a temperature greater than 250 Kelvin.

18. The method of claim 17 wherein each stage comprises a plurality of epitaxial layers.

19. The method of claim 18 wherein each stage has a substantially identical thickness.

20. The method of claim 17 wherein the substrate comprises indium phosphide (InP).

* * * * *